United States Patent
Park et al.

(10) Patent No.: US 9,184,188 B2
(45) Date of Patent: Nov. 10, 2015

(54) THIN-FILM TRANSISTOR ARRAY SUBSTRATE, ORGANIC LIGHT-EMITTING DISPLAY DEVICE INCLUDING THE SAME, AND METHOD OF MANUFACTURING THE THIN-FILM TRANSISTOR ARRAY SUBSTRATE

(71) Applicant: Samsung Display Co., Ltd., Yongin, Gyeonggi-Do (KR)

(72) Inventors: Jong-Hyun Park, Yongin (KR); Chun-Gi You, Yongin (KR); Seong-Kweon Heo, Yongin (KR); Jeong-Hwan Kim, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/061,150

(22) Filed: Oct. 23, 2013

(65) Prior Publication Data

US 2014/0346458 A1 Nov. 27, 2014

(30) Foreign Application Priority Data

May 24, 2013 (KR) .................. 10-2013-0059257

(51) Int. Cl.
  *H01L 29/08* (2006.01)
  *H01L 27/12* (2006.01)
  *H01L 51/52* (2006.01)
  *H01L 27/32* (2006.01)

(52) U.S. Cl.
  CPC .......... *H01L 27/1259* (2013.01); *H01L 27/124* (2013.01); *H01L 27/3276* (2013.01); *H01L 51/5253* (2013.01); *H01L 27/3248* (2013.01)

(58) Field of Classification Search
  CPC .................. H01L 27/3265; H01L 51/5253
  USPC ........................................................... 257/40
  See application file for complete search history.

(56) References Cited

U.S. PATENT DOCUMENTS

| 6,743,476 | B2 | 6/2004 | Hishida | |
|---|---|---|---|---|
| 8,395,160 | B2 | 3/2013 | Park et al. | |
| 2005/0110023 | A1* | 5/2005 | Lee et al. | 257/72 |
| 2005/0280002 | A1* | 12/2005 | Kang et al. | 257/72 |
| 2006/0081845 | A1 | 4/2006 | Bae | |
| 2012/0049191 | A1* | 3/2012 | You et al. | 257/59 |
| 2012/0080663 | A1* | 4/2012 | Lee et al. | 257/40 |

(Continued)

FOREIGN PATENT DOCUMENTS

| KR | 1020020051984 A | 7/2002 |
|---|---|---|
| KR | 20030003060 A | 1/2003 |

(Continued)

*Primary Examiner* — Thao X Le
*Assistant Examiner* — Laura Dykes
(74) *Attorney, Agent, or Firm* — Cantor Colburn LLP (57) ABSTRACT

A thin-film transistor ("TFT") array substrate includes: a TFT including an active layer, a gate electrode, a source electrode, a drain electrode, a first insulating layer disposed between the active layer and the gate electrode, and a second insulating layer disposed between the gate electrode, and the source and drain electrode; a pixel electrode including a transparent conductive oxide and disposed in an opening defined in the second insulating layer; a capacitor including a first electrode disposed on a layer on which the active layer is disposed, and a second electrode disposed on a layer on which the gate electrode is disposed; a pad electrode disposed on the second insulating layer and including a material substantially the same as a material in the source electrode and the drain electrode; a first protective layer disposed on the pad electrode; and a second protective layer disposed on the first protective layer.

16 Claims, 5 Drawing Sheets

(56) References Cited

U.S. PATENT DOCUMENTS

2013/0075735 A1* 3/2013 Watanabe et al. ............... 257/57
2013/0134424 A1* 5/2013 Kim et al. ...................... 257/59

FOREIGN PATENT DOCUMENTS

| KR | 1020060033240 A | 4/2006 |
| KR | 1020110052950 A | 5/2011 |

* cited by examiner

THIN-FILM TRANSISTOR ARRAY SUBSTRATE, ORGANIC LIGHT-EMITTING DISPLAY DEVICE INCLUDING THE SAME, AND METHOD OF MANUFACTURING THE THIN-FILM TRANSISTOR ARRAY SUBSTRATE

This application claims priority to Korean Patent Application No. 10-2013-0059257, filed on May 24, 2013, and all the benefits accruing therefrom under 35 U.S.C. §119, the content of which in its entirety is herein incorporated by reference.

BACKGROUND

1. Field

Exemplary embodiments of the invention relate to a thin-film transistor ("TFT") array substrate, an organic light-emitting display device including the TFT, and a method of manufacturing the TFT array substrate.

2. Description of the Related Art

A flat panel display apparatus, such as an organic light-emitting display apparatus and a liquid crystal display ("LCD") apparatus, typically includes a thin-film transistor ("TFT"), a capacitor, wires that connected therebetween, for example.

Such a flat panel display apparatus further includes a substrate, and the TFT, the capacitor and the wires may be provided in fine patterns on the substrate using a photolithographic process, in which a pattern is transferred using a mask, for example.

The photolithographic process is performed using a series of processes including applying a photoresistor, exposure, developing, etching, stripping (or ashing), etc. However, in the photolithographic process, the more processes using a mask, the higher mask manufacturing costs, and the number of operations of a manufacturing process.

SUMMARY

One or more exemplary embodiments of the invention relate to a thin-film transistor ("TFT") array substrate, an organic light-emitting display device including the TFT array substrate, and a method of manufacturing the TFT array substrate.

According to an exemplary embodiment of the invention, a TFT array substrate includes: a TFT including an active layer, a gate electrode disposed on the active layer, a source electrode connected to a source region of the active layer, a drain electrode connected to a drain region of the active layer, a first insulating layer disposed between the active layer and the gate electrode, and a second insulating layer disposed between the gate electrode and the source electrode, and between the gate electrode and the drain electrode; a pixel electrode disposed in an opening defined in the second insulating layer, where the pixel electrode includes a transparent conductive oxide; a capacitor including a first electrode disposed on a layer on which the active layer is disposed, and a second electrode disposed on a layer on which the gate electrode is disposed; a pad electrode disposed on the second insulating layer, where the pad electrode includes a material substantially the same as a material in the source electrode and the drain electrode; a first protective layer disposed on the pad electrode; and a second protective layer disposed on the first protective layer.

In an exemplary embodiment, the first protective layer may include an amorphous transparent conductive oxide.

In an exemplary embodiment, the transparent conductive oxide may include at least one of indium tin oxide ("ITO"), indium zinc oxide ("IZO"), zinc oxide ("ZnO"), indium oxide ($In_2O_3$), indium gallium oxide ("IGO"), and aluminum zinc oxide ("AZO").

In an exemplary embodiment, the second protective layer may include a polycrystalline transparent conductive oxide.

In an exemplary embodiment, the pad electrode may include a plurality of metal layers having different electron mobilities from each other.

In an exemplary embodiment, the plurality of metal layers may include a layer including molybdenum; and a layer including aluminum.

In an exemplary embodiment, the first protective layer may be disposed on the source and drain electrodes.

In an exemplary embodiment, the second protective layer may be disposed on the first protective layer on the source and drain electrodes.

In an exemplary embodiment, the active layer may include a semiconductor material doped with ion impurities.

In an exemplary embodiment, the first electrode may include a semiconductor material doped with ion impurities.

In an exemplary embodiment, the second electrode and the second insulating layer may be spaced apart from each other with a gap.

In an exemplary embodiment, the gate electrode may include a first layer including a transparent conductive oxide; and a second layer including a metal.

In an exemplary embodiment, the gate electrode, the source electrode, and the drain electrode may include substantially a same material as each other.

According to another exemplary embodiment of the invention, an organic light-emitting display apparatus includes: a TFT including an active layer, a gate electrode disposed on the active layer, a source electrode connected to a source region of the active layer, a drain electrode connected to a drain region of the active layer, a first insulating layer disposed between the active layer and the gate electrode, and a second insulating layer disposed between the gate electrode and the source electrode, and between the gate electrode and the drain electrode; a pixel electrode disposed in an opening defined in the second insulating layer, where the pixel electrode includes a transparent conductive oxide, and; a capacitor including a first electrode disposed on a layer on which the active layer is disposed, and a second electrode disposed on a layer on which the gate electrode is disposed; a pad electrode disposed on the second insulating layer, where the pad electrode includes a material substantially the same as a material in the source electrode and the drain electrode; a first protective layer disposed on the pad electrode; a second protective layer disposed on the first protective layer; a third insulating layer disposed on the second insulating layer, where an opening is defined in the third insulating layer, and the opening in the third insulating layer exposes the pixel electrode; an organic emission layer disposed on the pixel electrode; and an opposite electrode disposed on the organic emission layer.

In an exemplary embodiment, the first protective layer may include an amorphous transparent conductive oxide, and the second protective layer may include a polycrystalline transparent conductive oxide.

In an exemplary embodiment, the first protective layer and the second protective layer may be disposed on the source electrode and the drain electrode.

In an exemplary embodiment, the opposite electrode may be a reflective electrode.

According to another exemplary embodiment of the invention, a method of manufacturing a TFT array substrate includes: providing a semiconductor layer on a substrate, and patterning the semiconductor layer to provide an active layer of a thin-film transistor and a first electrode of a capacitor; providing a first insulating layer on the patterned semiconductor layer; providing a transparent conductive oxide layer and a first metal layer on the first insulating layer, and patterning the transparent conductive oxide layer and the first metal layer to provide a pixel electrode, a gate electrode of the thin-film transistor, and a second electrode of the capacitor; providing a second insulating layer on the patterned transparent conductive oxide layer and the patterned first metal layer, forming openings through the first insulating layer and the second insulating layer to expose source and drain regions of the active layer, and forming openings through the second insulating layer to expose the pixel electrode and the second electrode of the capacitor; providing a second metal layer and a first protective layer on the second insulating layer, and patterning the second metal layer and the first protective layer to form a source electrode, a drain electrode and a pad electrode, where the source electrode and the drain electrode are connected to the source and drain regions of the active layer through the openings which expose the source and drain regions of the active layer; providing a third insulating layer on the patterned second metal layer and the patterned first protective layer, and forming openings through the third insulating layer to expose the pixel electrode and the pad electrode; and providing a second protective layer on the first protective layer.

In an exemplary embodiment, the first metal layer and the second metal layer may include substantially a same material as each other.

In an exemplary embodiment, the second metal layer may include a plurality of metal layers having different electron mobilities from each other.

In an exemplary embodiment, the first protective layer may include an amorphous transparent conductive oxide.

In an exemplary embodiment, the second protective layer may include a polycrystalline transparent conductive oxide.

In an exemplary embodiment, the providing the second protective layer on the first protective layer may include performing plasma treatment on the first protective layer.

In an exemplary embodiment, the plasma treatment may be performed after the first protective layer on the pad electrode is exposed through the third insulating layer.

In an exemplary embodiment, the providing the second protective layer on the first protective layer may include thermally annealing the first protective layer.

In an exemplary embodiment, the thermal annealing may be performed before the first protective layer on the pad electrode is exposed through the third insulating layer.

BRIEF DESCRIPTION OF THE DRAWINGS

The above and other features of the invention will become more apparent by describing in detail exemplary embodiments thereof with reference to the attached drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 1:
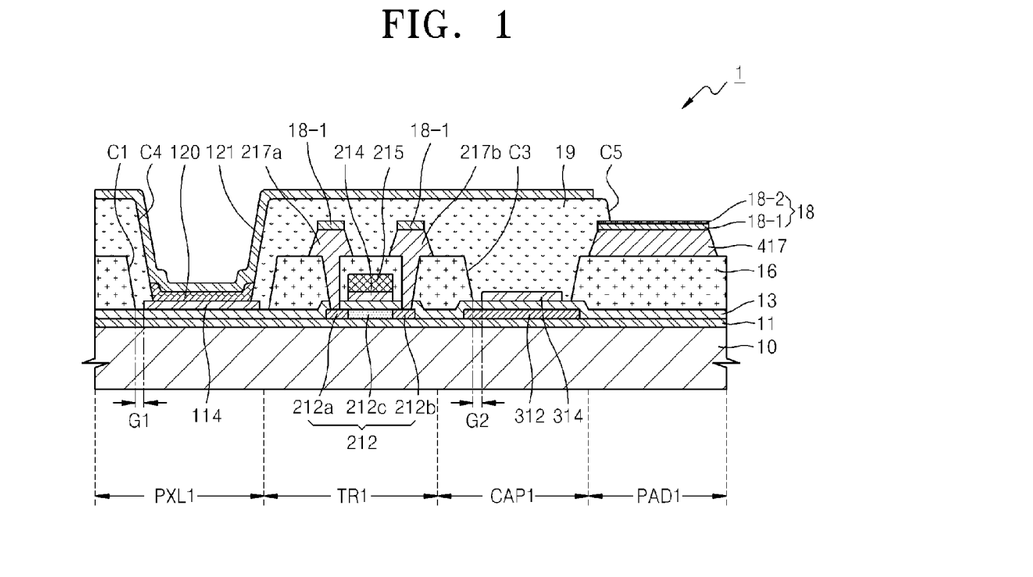
FIG. 1 is a schematic cross-sectional view of an exemplary embodiment of an organic light-emitting display apparatus according to the invention.

FIG. 1 is a schematic cross-sectional view of an exemplary embodiment of an organic light-emitting display apparatus 1 according to the invention.

Referring to FIG. 1, an exemplary embodiment of the organic light-emitting display device 1 includes a substrate 10, and a pixel region PXL1, a transistor region TR1, a capacitor region CAP1 and a pad region PAD1 are defined on the substrate 10.

The substrate 10 may be a glass substrate or a transparent substrate such as a plastic substrate including polyethylene terephthalate ("PET"), polyethylene naphthalate ("PEN") or polyimide, for example.

In such an embodiment, a buffer layer 11 is disposed on the substrate 10. The buffer layer 11 may provide a smooth or even surface on the substrate 10, and block or effectively prevent permeation of impurity elements into the substrate 10. In one exemplary embodiment, for example, the buffer layer 11 may be provided by forming an insulating layer in a single or multiple layer structure using a silicon nitride and/or a silicon oxide.

An active layer 212 is disposed in the transistor region TR1 of the buffer layer 11 on the buffer layer 11. The active layer 212 may include a semiconductor including amorphous or crystalline silicon, for example. The active layer 212 may include a channel region 212c, and a source region 212a and a drain region 212b that are doped with ion impurities and disposed at sides of the channel region 212c, respectively. In such an embodiment, the active layer 212 may include amorphous or crystalline silicon, but not being limited thereto. In one alternative exemplary embodiment, for example, the active layer 212 may include an oxide semiconductor.

In an exemplary embodiment, gate electrodes 214 and 215 corresponding to (e.g., overlapping when viewed from a top view) the channel region 212c of the active layer 212 are disposed on the active layer 212, and a first insulating layer 13, which is a gate insulating film, is disposed between the gate electrodes 214 and 215, and the active layer 212. The gate electrodes 214 and 215, each including a transparent conductive oxide, are sequentially disposed on the first insulating layer 13. In one exemplary embodiment, as shown in FIG. 1, a first layer 214 of the gate electrodes 214 and 215 is disposed on the first insulating layer 13, and a second layer 215 of the gate electrodes 214 and 215 is disposed on the first layer 214 of the gate electrodes 214 and 215. The first layer 214 of the gate electrodes 214 and 215 may include at least one of indium tin oxide ("ITO"), indium zinc oxide ("IZO"), zinc oxide (ZnO), indium oxide ($In_2O_3$), indium gallium oxide ("IGO") and aluminum zinc oxide ("AZO"), for example. The second layer 215 of the gate electrodes 214 and 215 may have a single or multiple layer structure including at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W) and copper (Cu), for example.

In an exemplary embodiment, a source electrode 217a and a drain electrode 217b connected to the source region 212a and the drain region 212b of the active layer 212 are disposed on the gate electrodes 214 and 215, and a second insulating layer 16, which is an interlayer insulating film, is disposed therebetween. The source electrode 217a and the drain electrode 217b may include a material substantially the same as the material included in the second layer 215 of the gate electrodes 214 and 215. In one exemplary embodiment, for example, the source electrode 217a and the drain electrode 217b may have a single or multiple layer structure including at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

In an exemplary embodiment, a first protective layer 18-1 is disposed on the source electrode 217a and the drain electrode 217b such that the source electrode 217a and the drain electrode 217b are effectively prevented from corroding due to moisture and oxygen. The first protective layer 18-1 may include an amorphous transparent conductive oxide. The transparent conductive oxide may include at least one of ITO, IZO, zinc oxide (ZnO), indium oxide ($In_2O_3$), IGO and AZO, for example. In an exemplary embodiment, as shown in FIG. 1, the first protective layer 18-1 may be disposed only on the source electrode 217a and the drain electrode 217b, but the invention is not limited thereto. In an alternative exemplary embodiment, the first protective layer 18-1 may be further disposed on wires (not shown) on a layer, on which the source electrode 217a and the drain electrode 217b are disposed.

In an exemplary embodiment, a third insulating layer 19 is disposed on the second insulating layer 16 and covers the source electrode 217a and the drain electrode 217b. In an exemplary embodiment, each of the first insulating layer 13 and the second insulating layer 16 may include a single/multiple inorganic insulating films, and the third insulating layer 19 may include an organic insulating film. In such an embodiment, the third insulating layer 19 may include a general-purpose polymer, e.g., polymethyl methacrylate ("PMMA") or polystyrene ("PS"), a phenol-group polymer derivative, an acryl-based polymer, an imide-based polymer, an aryl ether-based polymer, an amide-based polymer, a fluorine-based polymer, a p-xylene-based polymer, a vinyl alcohol-based polymer, or a mixture thereof.

In an exemplary embodiment, a pixel electrode 114 including substantially the same transparent conductive oxide as the first layer 214 of the gate electrodes 214 and 215 is disposed on the buffer layer 11 and the first insulating layer 13 in the pixel region PXL1 of the substrate 10.

In an exemplary embodiment, the second insulating layer 16 is disposed at external sides of the pixel electrode 114, and a first opening C1 is defined, e.g., formed, in the second insulating layer 16 to expose the pixel electrode 114. The first opening C1 may be larger than the pixel electrode 114 such that a first gap G1 is defined between an end of the pixel electrode 114 and an end of the second insulating layer 16. In such an embodiment, an aperture ratio may be increased by increasing an effective emission region. In an alternative exemplary embodiment, an end of the pixel electrode 114 and the second insulating layer 16 may overlap each other when viewed from a top view such that the first gap G1 is not defined between the end of the pixel electrode 114 and the end of the second insulating layer 16.

In an exemplary embodiment, the third insulating layer 19 is disposed on the second insulating layer 16, and a fourth opening C4 is defined in the third insulating layer 19 and exposes the pixel electrode 114. In such an embodiment, an end portion of the pixel electrode 114 and an portion of the third insulating layer 19 that defined the fourth opening C4 may overlap each other when viewed from a top view.

In an exemplary embodiment, an intermediate layer (not shown) including an organic emission layer 120 is disposed on the pixel electrode 114 in the fourth opening C4. The organic emission layer 120 may include a low or high molecular organic material.

In an exemplary embodiment, where the organic emission layer 120 includes the low-molecular organic material, a hole transport layer ("HTL"), a hole injection layer ("HIL"), an electron transport layer ("ETL") and an electron injection layer ("EIL"), for example, may be stacked or sequentially disposed on the intermediate layer. In an alternative exemplary embodiment, various layers other than the HTL, HIL, ETL and EIL may further be disposed or stacked on the intermediate layer. In such an embodiment, the organic material of the organic emission layer 120 may include copper phthalocyanine ("CuPc"), N(N'-Di(naphthalene-1-yl)-N), N'-diphenyl-benzidine ("NPB") or tris-8-hydroxyquinoline aluminum ("Alq3"), for example. In an alternative exemplary embodiment, where the organic emission layer 120 includes the high-molecular organic material, the intermediate layer may include an HTL. In one exemplary embodiment, the HTL may include poly-(3,4)-ethylene-dihydroxy thiophene ("PEDOT") or polyaniline ("PANI"), for example. In such an embodiment, the organic material of the organic emission layer 120 may include a poly-phenylenevinylene ("PPV")-based high-molecular organic material and a polyfluorene-based high-molecular organic material, for example. In an exemplary embodiment, sub pixels that emit red, green and blue lights in the organic emission layer 120 may collectively define a unit pixel.

In an exemplary embodiment, the organic emission layer 120 may be provided, e.g., formed, in the opening C4 using emission materials that emit different colors in every unit pixel, but not being limited thereto. In an exemplary embodiment, the organic emission layer 120 may be commonly provided on the third insulating layer 19 for each unit pixel. In such an embodiment, the organic emission layer 120 may be provided by vertically stacking layers, each including one of emission materials that emit, for example, red, green and blue lights, or by mixing the layers. In an alternative exemplary embodiment, a combination of different colors may be used to form the organic emission layer 120 that emits white light. The organic light-emitting display device 1 may further include a color conversion layer that converts the emitted white light into light having a predetermined color, or a color filter.

In an exemplary embodiment, various layers included in the intermediate layer except for the organic emission layer 120 may be commonly provided for all pixels or may be partially or independently provided in each unit pixel. In an exemplary embodiment, the intermediate layer may have a different thickness for each pixel. In an exemplary embodiment, the intermediate layer may include an organic material, but not being limited to the organic material, and the intermediate layer may include an inorganic material in an alternative exemplary embodiment.

In an exemplary embodiment, an opposite electrode 121, which may function as a common electrode, is disposed on the organic emission layer 120. The opposite electrode 121 may be a reflective electrode including a reflective material. In such an embodiment, the opposite electrode 121 may include at least one of Al, Mg, Li, Ca, LiF/Ca, and LiF/Al, for example. In such an embodiment, where the opposite electrode 121 is a reflective electrode, light emitted from the organic emission layer 120 may be reflected from the opposite electrode 121, pass through the pixel electrode 114 including a transparent conductive oxide, and then be discharged toward the substrate 10.

In an alternative exemplary embodiment, the pixel electrode 114 may further include a layer including a semi-transmissive metal. In such an embodiment, the pixel electrode 114 further including the semi-transmissive metal layer may have a micro-cavity structure together with the opposite electrode 121, which is a reflective electrode, thereby substantially improving the luminous efficient of the organic light-emitting display device 1.

In an exemplary embodiment, a first electrode 312, a second electrode 314 and the first insulating layer 13 disposed between the first electrode 312 and the second electrode 314 are disposed in the capacitor region CAP1.

In an exemplary embodiment, the first electrode 312 may include a semiconductor doped with ion impurities, which is substantially the same as the material included in the source region 212a and the drain region 122b. If an electrode is formed of an intrinsic semiconductor that is not doped with ion impurities, a capacitor defined by the electrode may have a metal oxide semiconductor ("MOS") capacitor structure. In an exemplary embodiment, the first electrode 312 includes ion impurities doped semiconductor, such that a capacitor has a metal-insulator-metal ("MIM") capacitor structure having a higher electrostatic capacitance than the MOS capacitor structure, thereby effectively maximizing the electrostatic capacitance. In such an embodiment, since the same electrostatic capacitance may be obtained with the MIM capacitor structure that is smaller than the MOS capacitor structure in size, a margin for reducing capacitor size substantially increases. Thus, the aperture ratio may be increased by increasing the size of the pixel electrode 114. In such an embodiment, since ion impurities-doped regions are continuously distributed in the first electrode 312, which will be described in greater detail later, the signal transfer quality of the capacitor may be substantially improved.

In an exemplary embodiment, the first insulating layer 13 that functions as a dielectric film is disposed on the first electrode 312 in the capacitor region CAP1.

In an exemplary embodiment, the second electrode 314 including the same transparent conductive oxide as the first layer 214 of the gate electrodes 214 and 215 is disposed on the first insulating layer 13 in the capacitor region CAP1.

In an exemplary embodiment, the second insulating layer 16 is disposed spaced apart from the second electrode 314 on the first insulating layer 13 in the capacitor region CAP1, and a third opening C3 is defined in the second insulating layer 16 to expose the second electrode 314. The third opening C3 may be larger than the second electrode 314 such that a second gap G2 is defined between an end of the second electrode 314 and an end of the second insulating layer 16.

In an exemplary embodiment, the third insulating layer 19 may be disposed on the second electrode 314, and may directly contact the first insulating layer 13 via the second gap G2. The third insulating layer 19 may include an organic insulating film. In such an embodiment, the third insulating layer 19 including an organic insulating material having a low permittivity is disposed or provided between the opposite electrode 121 and the second electrode 314, such that a parasitic capacitance that may occur between the opposite electrode 121 and the second electrode 314 is substantially reduced, and signal interference is thereby effectively prevented from occurring due to the parasitic capacitance.

In an exemplary embodiment, a pad electrode 417 and a protective layer 18 are disposed in the pad region PAD1, thereby defining a connection terminal of an external driver. In an exemplary embodiment, the protective layer 18 may include the first protective layer 18-1 and a second protective layer 18-2.

In an exemplary embodiment, the pad electrode 417 may include a same material as the source electrode 217a and the drain electrode 217b. In an exemplary embodiment, the pad electrode 417 may include a plurality of metal layers having different electron mobilities. In one exemplary embodiment, for example, the pad electrode 417 may have a multiple layer structure including at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

In an exemplary embodiment, the pad electrode 417 is disposed at a layer, on which the source electrode 217a and the drain electrode 217b are disposed. In such an embodiment, the pad electrode 417 may be directly disposed on the second insulating layer 16. In such an embodiment, the pad electrode 417 is provided later than the gate electrodes 214 and 215, the pixel electrode 114, and the first and second electrodes 312 and 314 during a manufacturing process thereof, such that the reliability of the pad electrode 417 may be effectively prevented from being lowered, which may be caused when the materials used to form the gate electrodes 214 and 215, the pixel electrode 114, the first electrode 312 or the second electrode 314 remain on the pad electrode 417 during the manufacturing process thereof or during a process for removing portions of the materials used to form the gate electrodes 214 and 215, the pixel electrode 114, the first electrode 312 or the second electrode 314 on the pad electrode 417.

The first protective layer 18-1 is disposed on the pad electrode 417. The first protective layer 18-1 protects the pad electrode 417 against moisture and oxygen. The first protective layer 18-1 may include an amorphous transparent conductive oxide.

In an exemplary embodiment, the second protective layer 18-2 including a polycrystalline transparent conductive oxide is disposed on the first protective layer 18-1. The second protective layer 18-2 may be provided by poly-crystallizing a surface of the first protective layer 18-1 and may effectively prevent contamination of the protective layer 18 or an increase in a resistance of the protective layer 18.

In an exemplary embodiment, the organic light-emitting display device 1 may further include an encapsulating member (not shown) configured to encapsulate a display region including the pixel region PXL1, the capacitor region CAP1, and the transistor region TR1. The encapsulating member may include a substrate including a glass material, a metal film, or an encapsulating thin film including an organic insulating film and an inorganic insulating film.

Hereinafter, an exemplary embodiment of a method of manufacturing the organic light-emitting display device 1 according to the invention will now be described with reference to FIGS. 2 and 7.

Figure 2:
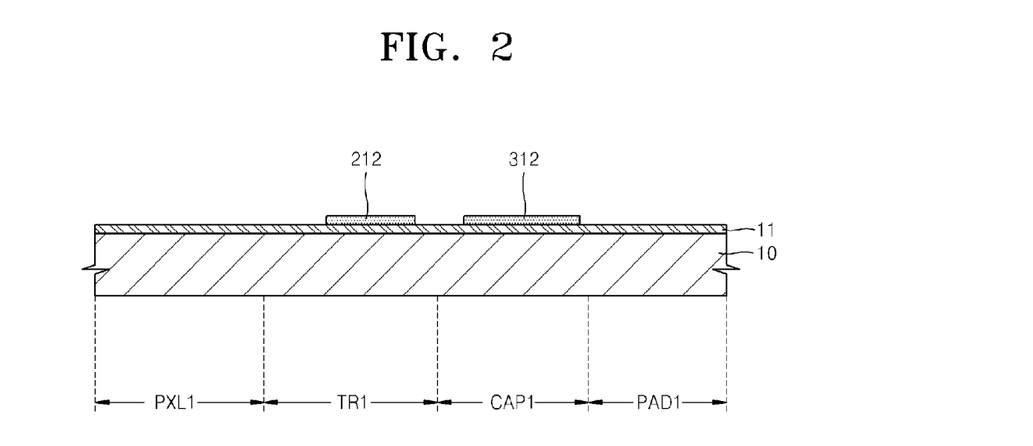
FIG. 2 is a cross-sectional view schematically illustrating a process of performing a first mask process of an exemplary embodiment of a method of manufacturing an organic light-emitting display apparatus according to an embodiment of the invention.

FIG. 2 is a cross-sectional view schematically illustrating a process of performing a first mask process of an exemplary embodiment of a method of manufacturing the organic light-emitting display apparatus 1 of FIG. 1 according to the invention.

Referring to FIG. 2, a buffer layer 11 is provided, e.g., formed, on a substrate 10, and a semiconductor layer (not shown) is formed on the buffer layer 11 and is then patterned to provide an active layer 212 of a thin-film transistor ("TFT") and a first electrode 312 of a capacitor.

In one exemplary embodiment, for example, a photoresistor (not shown) is applied onto the semiconductor layer, and the semiconductor layer is patterned by photolithography using a first photomask (not shown) to form the active layer 212 and the first electrode 312. The photolithography using the first photomask may include performing exposure on the first photomask using an exposure device (not shown) and performing a series of processes such as developing, etching, and stripping or ashing.

In an exemplary embodiment, the semiconductor layer may include amorphous silicon or polysilicon. In such an embodiment, the crystalline silicon may be formed by crystallizing amorphous silicon. Examples of a method of crystallizing amorphous silicon may include rapid thermal annealing ("RTA"), solid-phase crystallization ("SPC"), excimer laser annealing ("ELA"), metal induced crystallization ("MIC"), metal induced lateral crystallization ("MILC") and sequential lateral solidification ("SLS"), for example. In an alternative exemplary embodiment, the semiconductor layer may include an oxide semiconductor.

Figure 3:
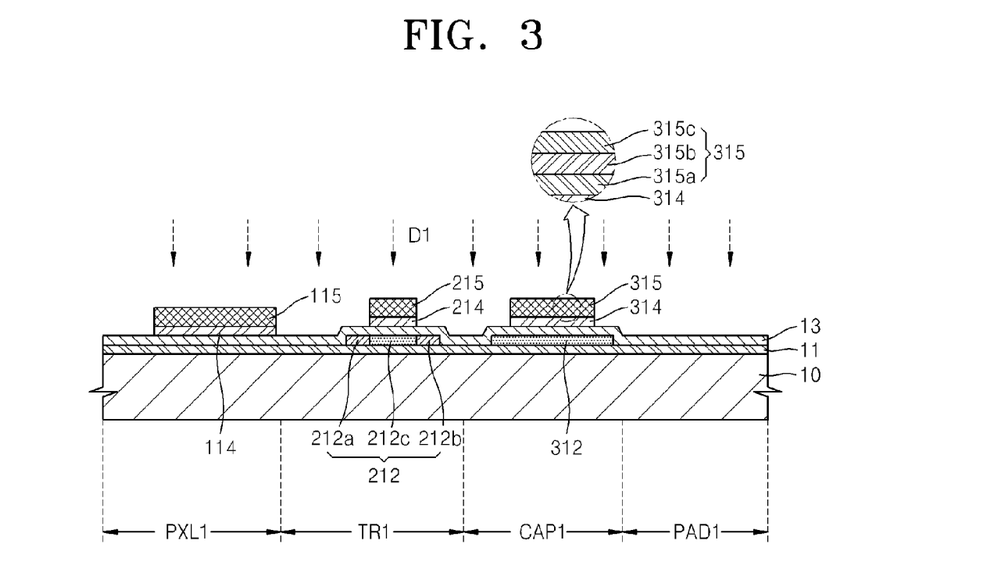
FIG. 3 is a cross-sectional view schematically illustrating a process of performing a second mask process of an exemplary embodiment of a method of manufacturing an organic light-emitting display apparatus according to the invention.

FIG. 3 is a cross-sectional view schematically illustrating a process of performing a second mask process of an exemplary embodiment of a method of manufacturing the organic light-emitting display apparatus 1 according to the invention.

Referring to FIG. 3, a first insulating layer 13 is formed on using the first mask process of FIG. 2, a transparent conductive oxide layer (not shown) and a first metal layer (not shown) are sequentially formed on the first insulating layer 13, and then patterned. In an exemplary embodiment, the first metal layer may have a single or multiple layer structure including at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu), for example.

By patterning the transparent conductive oxide layer (not shown) and the first metal layer (not shown) on the first insulating layer 13, gate electrodes 214 and 215, a second electrode 314 of the capacitor, an upper layer 315 of the second electrode 314, a pixel electrode 114 and an upper layer 115 of the pixel electrode 114 are provided on the first insulating layer 13. In one exemplary embodiment, for example, the upper layer 315 of the second electrode 314 provided by patterning the first metal layer may include a first layer 315a including molybdenum (Mo), a second layer 315b including aluminum (Al), and a third layer 315c including molybdenum (Mo).

Subsequently, primary doping D1 of ion impurities is performed. B or P ions may be doped as the ion impurities at a density of about $1 \times 10^{15}$ atoms per square centimeter (atoms/$cm^2$) or more using the active layer 212 of the TFT as a target. By doping the ion impurities onto the active layer 212 using the gate electrodes 214 and 215 as self-alignment masks, the active layer 212 is provided to include source and drain regions 212a and 212b doped with the ion impurities and a channel region 212c therebetween.

Figure 4:
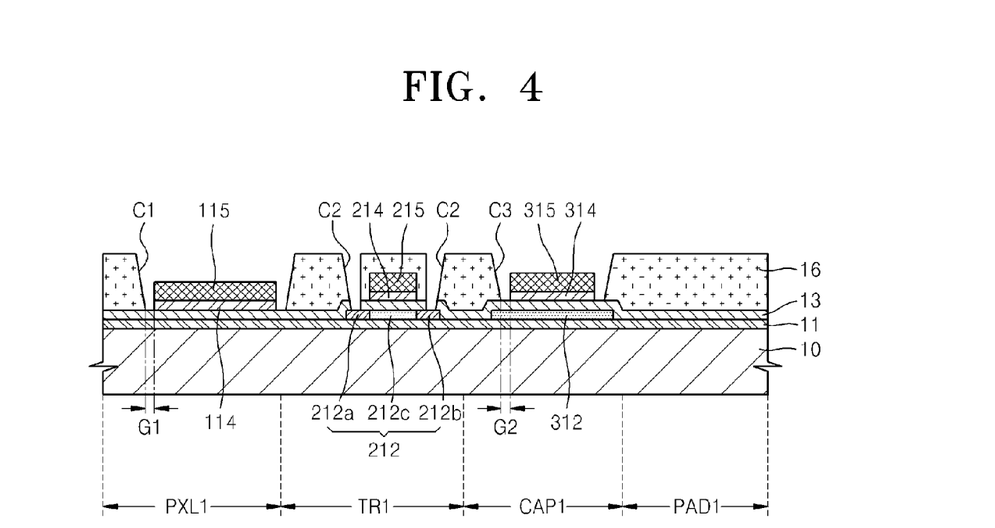
FIG. 4 is a cross-sectional view schematically illustrating an exemplary embodiment of a process of performing a third mask process of an organic light-emitting display apparatus according to the invention.

FIG. 4 is a cross-sectional view schematically illustrating a process of performing a third mask process of an exemplary embodiment of a method of manufacturing the organic light-emitting display apparatus 1 according to an embodiment of the invention.

Referring to FIG. 4, a second insulating layer 16 is formed after the performing the second mask process shown in FIG. 3, and is then patterned to provide a first opening C1 that exposes the pixel electrode 114 and the upper layer 115 of the pixel electrode 114, a second opening C2 that exposes the source region 212a and the drain region 212b, and a third opening C3 that exposes the second electrode 314 and the upper layer 315 of the second electrode 314. In an exemplary embodiment, the first opening C1 and the second opening C3 may expose substantially an entire upper surface of the pixel electrode 114 and substantially an entire upper surface of the second electrode 214, respectively. In such an embodiment, the size of the first opening C1 and the size of the second opening C3 is greater than a size of the pixel electrode 114 and the second electrode 214, respectively, such that a first gap G1 is defined between the pixel electrode 114 and the first opening C1, and a second gap G2 is defined between the second electrode 214 and the third opening C3.

Figure 5:
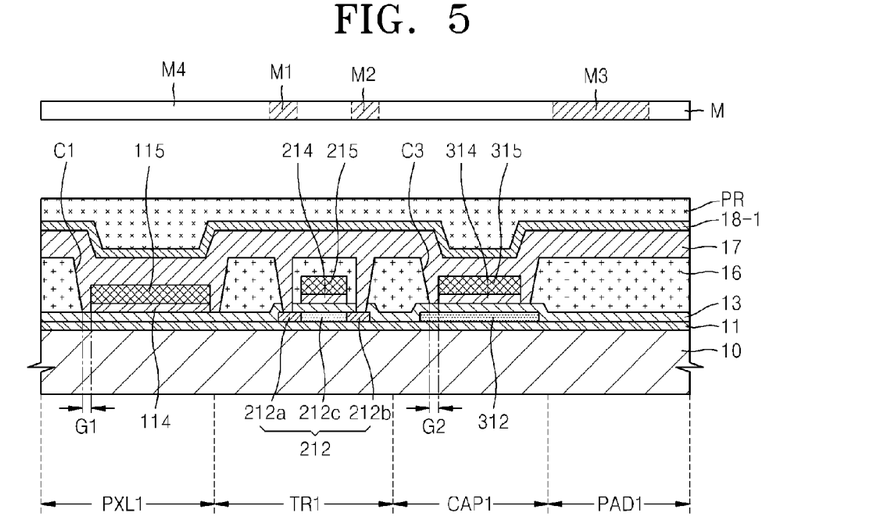
FIGS. 5 and 6 are cross-sectional views schematically illustrating a process of performing a fourth mask process of an exemplary embodiment of a method of manufacturing an organic light-emitting display apparatus according to the invention.
Figure 6:
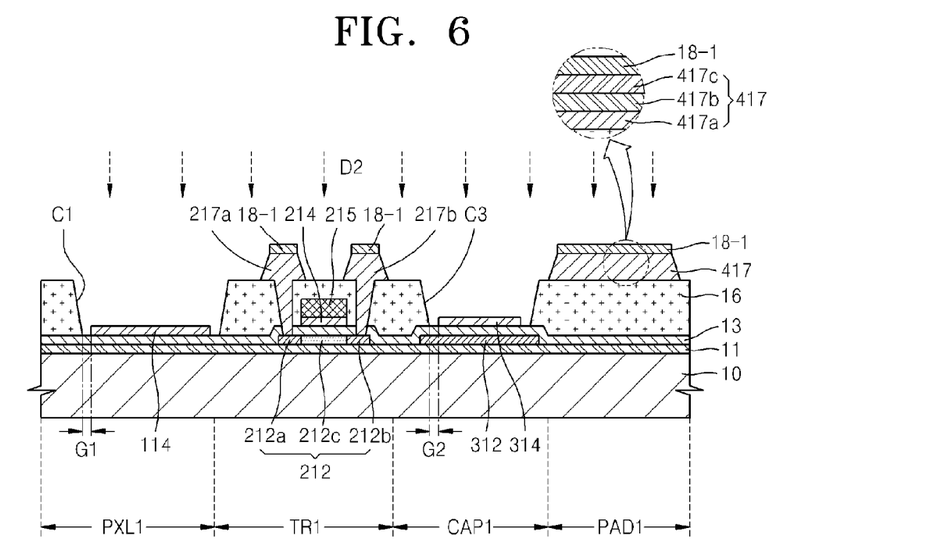

FIGS. 5 and 6 are cross-sectional views schematically illustrating a process of performing a fourth mask process of an exemplary embodiment of a method of manufacturing the organic light-emitting display apparatus 1 according to the invention.

Referring to FIG. 5, a mask M including light blocking portions M1, M2, and M3 and a light transmission portion M4 is prepared, and a second metal layer 17, a first protective layer 18-1, and a photoresistor PR are sequentially provided, e.g., formed, on the second insulating layer 16 including the first opening C1, the second opening C2 and the third opening C3 shown in FIG. 4.

Referring to FIG. 6, portions of the upper layer 115, the second metal layer 17 and the first protective layer 18-1 on the pixel electrode 114, and portions of the upper layer 315, the second metal layer 17 and the first protective layer 18-1 on the second electrode 314, which correspond to the light transmitting portion M4, are removed. The source electrode 217a and the drain electrode 217b, each including the first protective layer 18-1 thereon, are provided on the source region 212a and the drain region 212b using portions of the first protective layer 18-1 and the second metal layer 17 that correspond to light blocking portions M1 and M2, respectively. The pad electrode 417 including the first protective layer 18-1 is provided in the pad region PAD1 using a portion of the second metal layer 17 corresponding to the light blocking unit M3.

In an exemplary embodiment, the second metal layer 17 may include a plurality of metal layers having different electron mobilities. In one exemplary embodiment, for example, the pad electrode 417 provided by patterning the second metal layer 17 may include a first layer 417a including molybdenum (Mo), a second layer 417b including aluminum (Al), and a third layer 417c including molybdenum (Mo).

In an exemplary embodiment, the first protective layer 18-1 is patterned together with the second metal layer 17 in the same mask process to protect the source electrode 217a, the drain electrode 217b and the pad electrode 417 against moisture and oxygen.

After removing the portions of the second metal layer 17 and the first protective layer 18-1 on the upper layer 115 of the pixel electrode 114, and the portions of the second metal layer 17 and the first protective layer 18-1 on the upper layer 315 of the second electrode 314, secondary doping D2 of ion impurities is performed using the first electrode 312 as a target. The first electrode 312 that was not doped with ion impurities during the first doping D1 is doped with ion impurities during the secondary doping D2 to form a MIM capacitor together with the second electrode 314. In such an embodiment, ion impurities are continuously doped onto the first electrode 312 via the second gap G2 between an end of the second electrode 314 and an end of the second insulating layer 16, such that the signal transfer quality of the capacitor may be effectively prevented from being degraded.

In an exemplary embodiment, during the fourth mask process, the second metal layer 17 and the first protective layer 18-1 may be patterned together to form a data wire (not shown).

Figure 7:
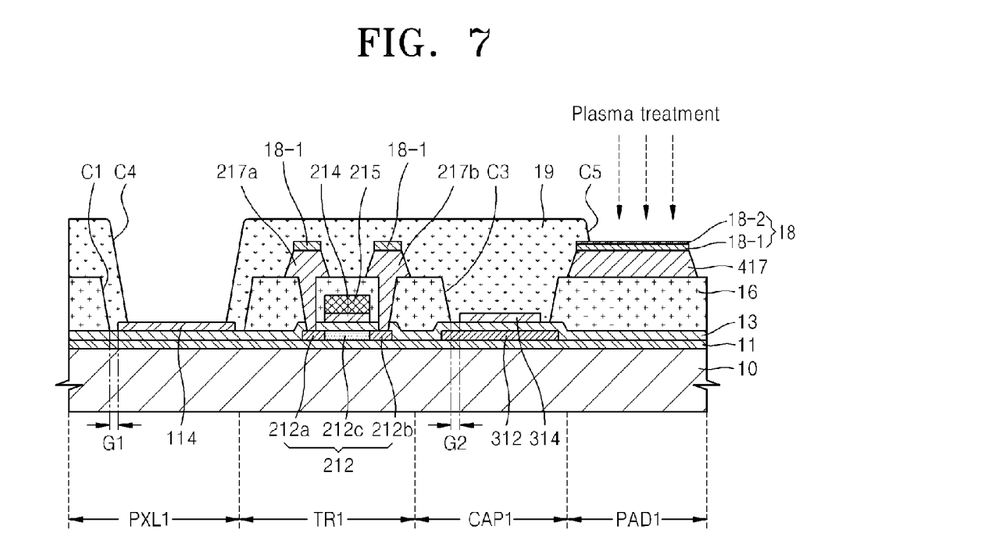
FIG. 7 is a cross-sectional view schematically illustrating a process of performing a fifth mask process and a plasma treatment process of an exemplary embodiment of a method of manufacturing an organic light-emitting display apparatus according to the invention.

FIG. 7 is a cross-sectional view schematically illustrating a process of performing a fifth mask process and a plasma treatment process of an exemplary embodiment of a method of manufacturing the organic light-emitting display apparatus 1 according to an embodiment of the invention.

Referring to FIG. 7, the third insulating layer 19 is formed after performing the fourth mask process shown in FIG. 6, and the fifth mask process is performed to form the fourth opening C4 that exposes an upper portion of the pixel electrode 114 and a fifth opening C5 that exposes the first protective layer 18-1 on the pad electrode 417.

The third insulating layer 19 functions as a pixel defining layer, and may be an organic insulating film that includes, for example, a general-purpose polymer (e.g., PMMA or polystyrene PS), a phenol-group polymer derivative, an acryl-based polymer, an imide-based polymer, an aryl ether-based polymer, an amide-based polymer, a fluorine-based polymer, a p-xylene-based polymer, a vinyl alcohol-based polymer, or a mixture thereof. While the third insulating layer 19 is hardened, a surface of the first protective layer 18-1 may be contaminated due to a carbon source in the organic insulating film, thereby increasing the resistance of the first protective layer 18-1.

In an exemplary embodiment, after the fifth mask process, the characteristics of a device, e.g., the TFT, may be measured using the pad electrode 417 before providing the organic emission layer 120. When the surface of the first protective layer 18-1 is contaminated, device characteristics may be degraded. In an exemplary embodiment, a surface of the first protective layer 18-1 is poly-crystallized to form the second protective layer 18-2 by performing plasma treatment on the first protective layer 18-1 on the pad electrode 417 to effectively prevent the degradation of the device characteristics after the third insulating layer 19 is hardened.

Figure 8:
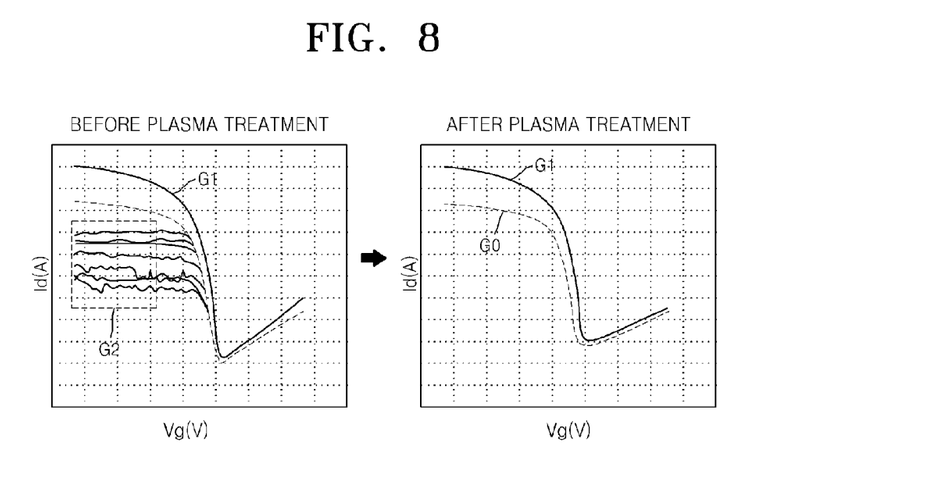
FIG. 8 are graphs showing a relation between a gate voltage and a drain current with respect to drain voltages of an exemplary embodiment of a thin-film transistor measured before and after plasma treatment.

FIG. 8 are graphs showing the relation between a gate voltage $V_g$ and a drain current $I_d$ with respect to drain voltages $V_d$ of a TFT measured before and after plasma treatment.

In FIG. 8, a left graph is a voltage-current ("V-I") graph, when a pad electrode was formed in a three-layer structure including molybdenum, aluminum, and molybdenum and a first protective layer was formed using amorphous indium zinc oxide ("IZO") on the pad electrode and before plasma treatment was performed on the first protective layer, and a right graph is a V-I graph after plasma treatment was performed on the first protective layer.

'G0' represents the relation between a 'normal' gate voltage $V_g$ and a drain current $I_d$ with respect to a bias voltage (e.g., the drain voltage $V_D$=about −0.1 volt (V)), 'G1' represents the relation between the gate voltage $V_g$ and the drain current $I_d$ when the drain voltage $V_D$ is −5.1 V, and 'G2' represents the relation between an 'abnormal' gate voltage $V_g$ and the drain current $I_d$ with respect to a bias voltage (e.g., the drain voltage $V_D$=about −0.1 V).

In FIG. 8, the V-I graph when the bias voltage was applied and the V-I graph when the drain voltage $V_D$ was increased were compared to determine whether the device characteristics are degraded or not, to measure the device characteristics of the TFT.

Referring to the left graph of FIG. 8, before plasma treatment was performed on the first protective layer 18-1, a plurality of V-I graphs G2 show an abnormal distribution with respect to a section of the bias voltage. Thus, a result of measuring the device characteristics shows that the device characteristics were degraded.

Referring to the right graph of FIG. 8, after plasma treatment was performed on the first protective layer 18-1 to remove pollutants therefrom and the second protective layer 18-2 was formed by poly-crystallizing the first protective layer 18-1, the V-I graph shows a normal distribution with respect to a bias voltage range. Thus, the result of measuring the device characteristics shows that the device characteristics were effectively prevented from being degraded.

In an exemplary embodiment of the organic light-emitting display device 1, the protective layer 18 may be disposed on the pad electrode 417 to effectively prevent the pad electrode 417 from corroding, and a surface of the protective layer 18 may be poly-crystallized by performing plasma treatment thereon to effectively prevent contamination of the protective layer 18 and to reduce the resistance of the protective layer 18, thereby effectively preventing the device characteristics from being degraded.

Although not shown in FIGS. 2-7, after the fifth mask process is performed, the organic emission layer 120 may be provided on the pixel electrode 114, and the opposite electrode 121 of FIG. 1, which is a common electrode, may be provided on the organic emission layer 120, thereby completing the organic light-emitting display device 1 of FIG. 1. An encapsulating member (not shown) may further be formed on the opposite electrode 121.

Hereinafter, an alternative exemplary embodiment of an organic light-emitting display device 2 according to the invention will now be described with reference to FIGS. 9 and 10.

Figure 9:
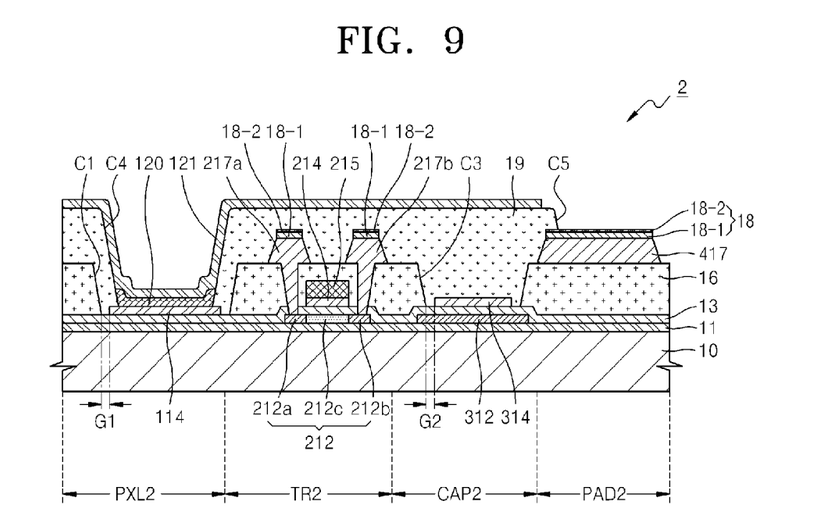
FIG. 9 is a schematic cross-sectional view of an alternative exemplary embodiment of an organic light-emitting display apparatus according to the invention.

FIG. 9 is a schematic cross-sectional view of an alternative exemplary embodiment of the organic light-emitting display apparatus 2 according to the invention.

The circuit diagram in FIG. 9 is substantially the same as the organic light-emitting display device shown in FIG. 1 except for the second protective layer 18-2. The same or like elements shown in FIG. 9 have been labeled with the same reference characters as used above to describe the exemplary embodiments of the organic light-emitting display device shown in FIG. 1, and any repetitive detailed description thereof may be omitted or simplified.

Referring to FIG. 9, the organic light-emitting display device 2 includes a substrate 10, and a pixel region PXL2, a transistor region TR2, a capacitor region CAP2 and a pad region PAD2 are defined on the substrate 10. In such an embodiment, the structures of the pixel region PXL2 and the capacitor region CAP2 are the same as in the exemplary embodiment shown in FIG. 1, and thus, the detailed description thereof will be omitted.

In such an embodiment, a protective layer 18 is disposed on the pad electrode 417 in the pad region PAD2. The protective layer 18 includes a first protective layer 18-1 including an amorphous transparent conductive oxide, and a second protective layer 18-2 including a polycrystalline transparent conductive oxide. The transparent conductive oxide may include at least one of ITO, IZO, zinc oxide (ZnO), indium oxide ($In_2O_3$), IGO and AZO.

In such an embodiment, the second protective layer 18-2 is disposed on the first protective layer 18-1, and an exemplary embodiment of a process of providing the second protective layer 18-2 will be described later in greater detail.

The first protective layer 18-1 protects the pad electrode 417 against moisture and oxygen. The second protective layer 18-2 effectively prevents contamination of the first protective layer 18-1 and an increase in resistance of the first protective layer 18-1.

In such an embodiment, a first protective layer 18-1 and a second protective layer 18-2 are disposed on a source electrode 217a and a drain electrode 217b in the transistor region TR2 to effectively prevent the source electrode 217a and the drain electrode 217b from corroding due to moisture and oxygen. The first protective layer 18-1 may include an amorphous transparent conductive oxide, and the second protective layer 18-2 may include a polycrystalline transparent conductive oxide. In such an embodiment, the first protective layer 18-1 and the second protective layer 18-2 are provided on the source electrode 217a and the drain electrode 217b, as shown in FIG. 9, but not being limited thereto. In an alternative exemplary embodiment, the first protective layer 18-1 and the second protective layer 18-2 may be further provided on a wire (not shown) formed on the layer on which the source electrode 217a and the drain electrode 217b are formed.

Hereinafter, an exemplary embodiment of a method of manufacturing the organic light-emitting display device 2 shown in FIG. 9 will be described. In such an embodiment, first to third mask processes of a method of manufacturing the organic light-emitting display device 2 are substantially the same as the first to third mask processes of the exemplary embodiment of a method of manufacturing the organic light-emitting display device 1 shown in FIGS. 2 to 4, and thus, the detailed description thereof will be omitted.

Figure 10:
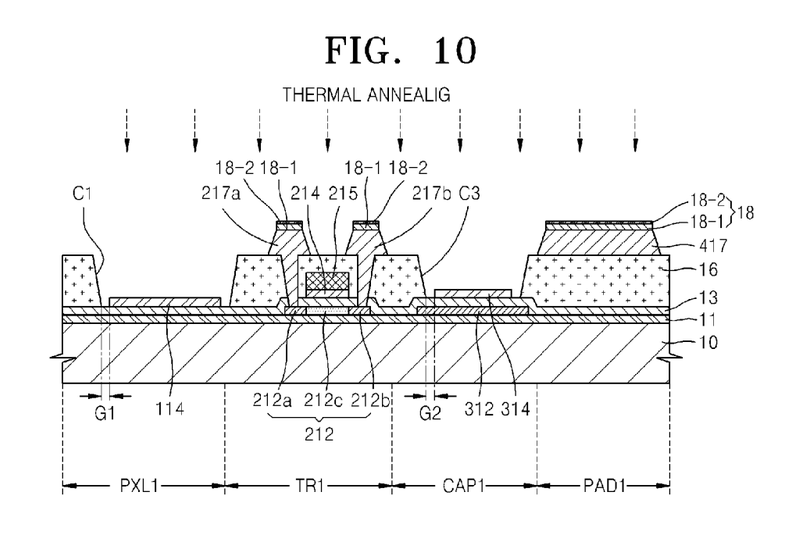
FIG. 10 is a cross-sectional view schematically illustrating a process of performing a fourth mask process and a thermal annealing process of an exemplary embodiment of a method of manufacturing the organic light-emitting display apparatus of FIG. 9 according to the invention.

FIG. 10 is a cross-sectional view schematically illustrating a process of performing a fourth mask process and a thermal annealing process of an exemplary embodiment of a method of manufacturing the organic light-emitting display apparatus 2 of FIG. 9 according to the invention.

Referring back to FIG. 6, after performing the fourth mask process, the first protective layer 18-1 is provided on the source electrode 217a, the drain electrode 217b and the pad electrode 417, and the secondary doping D2 of ion impurities is performed on the first electrode 312 of the capacitor.

Referring to FIG. 10, before the fifth mask process is performed to pattern the third insulating layer 19, the first protective layer 18-1 is thermally annealed to polycrystallize the first protective layer 18-1, thereby providing, e.g., forming, a second protective layer 18-2 on the first protective layer 18-1.

After the second protective layer 18-2 is provided, the fifth mask process is performed. In the fifth mask process, when the third insulating layer 19 is hardened during patterning of the third insulating layer 19, the second protective layer 18-2 effectively prevents the contamination of the first protective layer 18-1 and an increase in the resistance of the first protective layer 18-1 on the pad electrode 417. Accordingly, device characteristics may be effectively prevented from being degraded.

As described herein, in exemplary embodiments of a TFT array substrate, an organic light-emitting display apparatus including the TFT array substrate and a method of manufacturing the TFT array substrate, the TFT array substrate and the organic light-emitting display apparatus may be manufactured using five mask processes.

In such embodiments, a pad electrode may be effectively prevented from corroding by providing, e.g., forming, a protective layer on the pad electrode.

In such embodiments, contamination of the protective layer and an increase in the resistance of the protective layer are effective prevented by poly-crystallizing a surface of the protective layer.

In such embodiments, a phenomenon that may occur when a lower electrode of a capacitor is not doped with ion impurities may be effectively prevented from occurring, thereby substantially increasing an electrostatic capacitance and substantially improving the signal transfer quality of a capacitor wire.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A thin-film transistor array substrate comprising:
   a thin-film transistor comprising:
      an active layer;
      a gate electrode disposed on the active layer;
      a source electrode connected to a source region of the active layer;
      a drain electrode connected to a drain region of the active layer;
      a first insulating layer disposed between the active layer and the gate electrode; and
      a second insulating layer disposed between the gate electrode and the source electrode, and between the gate electrode and the drain electrode;
   a pixel electrode disposed in an opening defined in the second insulating layer, wherein the pixel electrode comprises a transparent conductive oxide, and;
   a capacitor comprising:
      a first electrode disposed on a layer, on which the active layer is disposed; and
      a second electrode disposed on a layer, on which the gate electrode is disposed;
   a pad electrode disposed on the second insulating layer, wherein the pad electrode comprises a material substantially the same as a material in the source electrode and the drain electrode;
   a first protective layer disposed on the pad electrode; and
   a second protective layer disposed on the first protective layer,
   wherein the first and second protective layer comprise different materials from each other, and different materials from the pad electrode,
   wherein the pad electrode has an upper surface, and the first and second protective layers cover the entire upper surface of the pad electrode, and
   wherein the first protective layer comprises an amorphous transparent conductive oxide.

2. The thin-film transistor array substrate of claim 1, wherein the transparent conductive oxide comprises at least one of indium tin oxide, indium zinc oxide, zinc oxide (ZnO), indium oxide ($In_2O_3$), indium gallium oxide and aluminum zinc oxide.

3. The thin-film transistor array substrate of claim 1, wherein the second protective layer comprises a polycrystalline transparent conductive oxide.

4. The thin-film transistor array substrate of claim 1, wherein the pad electrode comprises a plurality of metal layers having different electron mobilities from each other.

5. The thin-film transistor array substrate of claim 4, wherein the plurality of metal layers comprises:
   a layer comprising molybdenum; and
   a layer comprising aluminum.

6. The thin-film transistor array substrate of claim 1, wherein the first protective layer is disposed on the source and drain electrodes.

7. The thin-film transistor array substrate of claim 6, wherein the first protective layer is disposed between the second protective layer and the source electrode, and between the second protective layer and the drain electrode.

8. The thin-film transistor array substrate of claim 1, wherein the active layer comprises a semiconductor material doped with ion impurities.

9. The thin-film transistor array substrate of claim 1, wherein the first electrode comprises a semiconductor material doped with ion impurities.

10. The thin-film transistor array substrate of claim 1, wherein the second electrode and the second insulating layer are spaced apart from each other by a gap.

11. The thin-film transistor array substrate of claim 1, wherein the gate electrode comprises:
    a first layer comprising a transparent conductive oxide; and
    a second layer comprising a metal.

12. The thin-film transistor array substrate of claim 1, wherein the gate electrode, the source electrode and the drain electrode comprise substantially a same material as each other.

13. An organic light-emitting display apparatus comprising:
a thin-film transistor comprising:
an active layer;
a gate electrode disposed on the active layer;
a source electrode connected to a source region of the active layer;
a drain electrode connected to a drain region of the active layer;
a first insulating layer disposed between the active layer and the gate electrode; and
a second insulating layer disposed between the gate electrode and the source electrode, and between the gate electrode and the drain electrode;
a pixel electrode comprising a transparent conductive oxide, and disposed in an opening defined in the second insulating layer;
a capacitor comprising:
a first electrode disposed on a layer, on which the active layer is disposed; and
a second electrode disposed on a layer, on which the gate electrode is disposed;
a pad electrode disposed on the second insulating layer, and comprising a material substantially the same as a material in the source electrode and the drain electrode;
a first protective layer disposed on the pad electrode;
a second protective layer disposed on the first protective layer;
a third insulating layer disposed on the second insulating layer, wherein an opening is defined in the third insulating layer, and the opening in the third insulating layer exposes the pixel electrode;
an organic emission layer disposed on the pixel electrode; and
an opposite electrode disposed on the organic emission layer,
wherein the first and second protective layer comprise different materials from each other, and different materials from the pad electrode,
wherein the pad electrode has an upper surface, and the first and second protective layers cover the entire upper surface of the pad electrode, and
wherein the first protective layer comprises an amorphous transparent conductive oxide.

14. The organic light-emitting display apparatus of claim 13, wherein the second protective layer comprises a polycrystalline transparent conductive oxide.

15. The organic light-emitting display apparatus of claim 13, wherein the first protective layer and the second protective layer are disposed on the source electrode and the drain electrode.

16. The organic light-emitting display apparatus of claim 13, wherein the opposite electrode is a reflective electrode.

* * * * *